(12) United States Patent
Chan et al.

(10) Patent No.: US 7,442,611 B2
(45) Date of Patent: Oct. 28, 2008

(54) METHOD OF APPLYING STRESSES TO PFET AND NFET TRANSISTOR CHANNELS FOR IMPROVED PERFORMANCE

(75) Inventors: Victor W. C. Chan, New Paltz, NY (US); Yong M. Lee, Singapore (SG); Haining Yang, Wappingers Falls, NY (US)

(73) Assignee: International Busines Machines Corporation, Armonk, NY (US)

( * ) Notice: Subject to any disclaimer, the term of this patent is extended or adjusted under 35 U.S.C. 154(b) by 0 days.

(21) Appl. No.: 11/657,154

(22) Filed: Jan. 24, 2007

(65) Prior Publication Data

US 2007/0122982 A1    May 31, 2007

Related U.S. Application Data

(62) Division of application No. 10/904,808, filed on Nov. 30, 2004, now Pat. No. 7,193,254.

(51) Int. Cl.
    *H01L 21/8234* (2006.01)
(52) U.S. Cl. .................................. 438/275; 438/200
(58) Field of Classification Search ............... 437/275, 437/200
    See application file for complete search history.

(56) References Cited

U.S. PATENT DOCUMENTS

| | | | |
|---|---|---|---|
| 6,984,654 B2 * | 1/2006 | Camden | 514/388 |
| 7,193,254 B2 * | 3/2007 | Chan et al. | 257/274 |
| 2003/0181005 A1 * | 9/2003 | Hachimine et al. | 438/231 |
| 2005/0285137 A1 * | 12/2005 | Satoh | 257/178 |
| 2007/0102768 A1 * | 5/2007 | Shimizu et al. | 257/369 |

* cited by examiner

*Primary Examiner*—Long Pham
(74) *Attorney, Agent, or Firm*—Joseph Petrokaitis; Daryl K. Neff

(57) ABSTRACT

A method is provided for fabricating a semiconductor device structure. In such method a p-type field effect transistor (PFET) and an n-type field effect transistor (NFET), each of the NFET and the PFET having a conduction channel disposed in a single-crystal semiconductor region of a substrate. A stressed film having a compressive stress at a first magnitude can be formed to overlie the PFET and the NFET. Desirably, a mask is formed to cover the PFET while exposing the NFET, after which, desirably, a portion of the stressed film overlying the NFET is subjected to ion implantation, while the mask protects another portion of the stressed film overlying the PFET from the ion implantation. The substrate can then be annealed, whereby, desirably, the compressive stress of the implanted portion of the stressed film is much reduced from the first magnitude by the annealing. In such way, the implanted portion of the stressed film overlying the NFET desirably imparts one of a much reduced magnitude compressive stress, a zero stress and a tensile stress to the conduction channel of the NFET. Another portion of the stressed film can continue to impart the compressive stress at the first magnitude to the conduction channel of the PFET.

7 Claims, 4 Drawing Sheets

METHOD OF APPLYING STRESSES TO PFET AND NFET TRANSISTOR CHANNELS FOR IMPROVED PERFORMANCE

CROSS-REFERENCE TO RELATED APPLICATION

The present application is a division of U.S. application Ser. No. 10/904,808 filed Nov. 30, 2004, now U.S. Pat. No. 7,193,254 the disclosure of which is hereby incorporated by reference herein.

BACKGROUND OF THE INVENTION

The present invention relates to the fabrication of semiconductor integrated circuits, and more specifically to an apparatus and method of making strained channel complementary metal oxide semiconductor (CMOS) transistors.

Both theoretical and empirical studies have demonstrated that carrier mobility in a transistor can be greatly increased when a stress of sufficient magnitude is applied to the conduction channel of a transistor to create a strain therein. Stress is defined as force per unit area. Strain is a dimensionless quantity defined as the unit change, for example a percentage change, in a particular dimension of an item, in relation to the initial dimension of that item. An example of strain is the change in length versus the original length, when a force is applied in the direction of that dimension of the item: for example in the direction of its length. Strain can be either tensile or compressive. In p-type field effect transistors, the application of a compressive longitudinal stress, i.e. in the direction of the length of the conduction channel, creates a strain in the conduction channel which is known to increase the drive current of a PFET. However, if the same compressive stress is applied to the conduction channel of an NFET, its drive current decreases. However, when a tensile stress is applied to the conduction channel of an n-type field effect transistor (NFET), the drive current of the NFET increases.

Accordingly, it has been proposed to increase the performance of an NFET by applying a tensile longitudinal stress to the conduction channel of the NFET, while increasing the performance of a PFET by applying a compressive longitudinal stress to its conduction channel. Several ways have been proposed to impart different kinds of stresses to different regions of a wafer that house NFET and PFET transistors. In one example, mechanical stress is manipulated by altering the materials in shallow trench isolation regions (STIs) disposed adjacent to the conduction channels of FETs to apply a desired stress thereto. Other proposals have centered on modulating intrinsic stresses present in spacer features. Yet other proposals have focused on introducing etch-stop layers such as those that include silicon nitride.

SUMMARY OF THE INVENTION

According to an aspect of the invention, a method is provided for fabricating a semiconductor device structure. In such method a p-type field effect transistor (PFET) and an n-type field effect transistor (NFET), each of the NFET and the PFET having a conduction channel disposed in a single-crystal semiconductor region of a substrate. A stressed film having a compressive stress at a first magnitude can be formed to overlie the PFET and the NFET. Desirably, a mask formed to cover the PFET while exposing the NFET, after which, desirably, a portion of the stressed film overlying the NFET is subjected to ion implantation, while the mask protects another portion of the stressed film overlying the PFET from the ion implantation. The substrate can then be annealed, whereby, desirably, the compressive stress of the implanted portion of the stressed film is much reduced from the first magnitude by the annealing. In such way, the implanted portion of the stressed film overlying the NFET desirably imparts one of a much reduced magnitude compressive stress, a zero stress and a tensile stress to the conduction channel of the NFET. Another portion of the stressed film can continue to impart the compressive stress at the first magnitude to the conduction channel of the PFET.

In accordance with one or more particular aspects of the invention, an intermediate layer can be formed to overlie the PFET between the first and the second stressed films, the intermediate layer not overlying the NFET. A second stressed film may be formed to overlie the PFET and the NFET, such that the second stressed film imparts a tensile stress to the conduction channel of the NFET.

DETAILED DESCRIPTION

Figure 1:
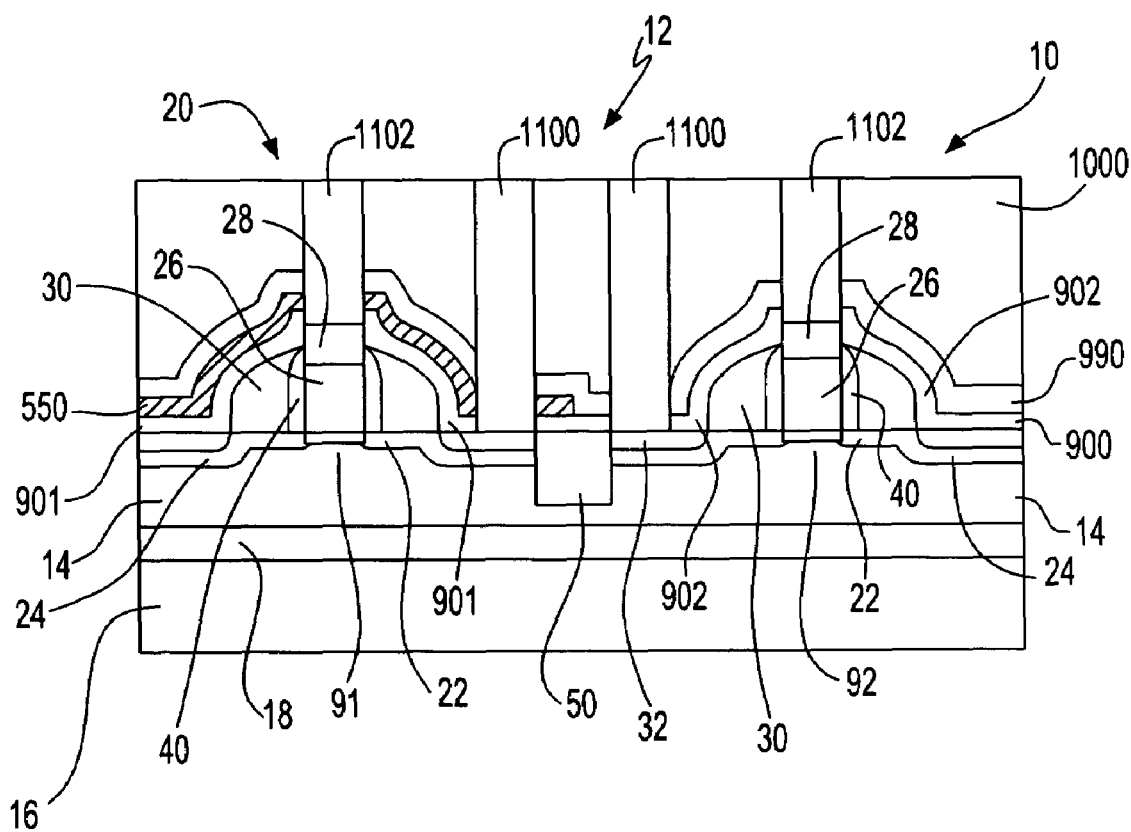
FIG. 1 illustrates a structure including a PFET and an NFET according to an embodiment of the invention.

FIG. 1 is a cross-sectional view illustrating one embodiment of the present invention. As shown in FIG. 1, a single-crystal semiconductor region 14 is illustrated in which two semiconductor devices are provided, such as NFET 10 and PFET 20 of complementary metal oxide semiconductor (CMOS) circuitry. The NFET and PFET are separated by shallow trench isolation (STI) region 50. As discussed earlier, an appropriate stress applied to a transistor channel region can significantly increase carrier mobility, resulting in improved performance. As shown in FIG. 1, a unitary stressed film 900 is disposed over both the PFET 20 and the NFET 10 to impart stresses to each transistor.

In the exemplary structure shown in FIG. 1, the unitary stressed film 900 includes two portions, a first portion 901 that imparts a compressive stress having a first magnitude to the conduction channel 91 of the PFET 20 and a second portion 902 that overlies the NFET 10. Although the second portion 902 is part of the same unitary stressed film 900 as the first portion 901, the second portion does not impart a compressive stress at the first magnitude to the conduction channel 92 of the NFET 10. This is because the second portion 902 includes an ion concentration which is not present in the first portion. The ion concentration causes the second portion 902 to have a different magnitude of stress, or even a different type of stress, i.e., a tensile stress. The second portion 902 has either a compressive stress having a magnitude much lower than the first magnitude, zero stress, or a tensile stress. By way of example, in one embodiment of the invention, the unitary stressed film 900 consists essentially of a nitride such as silicon nitride and the ion concentration in the second portion includes germanium (Ge) ions.

In a preferred embodiment, illustrated in FIG. 1, a second stressed film 990 is disposed over the first portion 901 and the second portion 902 of the unitary stressed film. The second stressed film 990 is a tensile stressed film, imparting a tensile stress to the conduction channel of the NFET 10. Thus, the second stressed film is disposed over both the compressive stressed first portion 901 and over the second portion 902 of stressed film 900. In order that the tensile stressed second film 990 does not affect the compressive stress applied to the PFET by the underlying compressive stressed first portion 901, an intermediate layer 550 is disposed over the PFET 20 to space the second film at a sufficient distance from the compressive stressed portion 901 of the underlying unitary stressed film. The intermediate layer 550 is disposed on the first stressed film 900 but only overlying the PFET 20 and not the overlying NFET 10.

The second stressed film 990 can be formed of a variety of materials. In a preferred embodiment, the second stressed film 990 consists essentially of a nitride, such as silicon nitride. In one embodiment, the intermediate layer 550 has a thickness measuring between 100 Å and 300 Å and includes a conformal dielectric material, the layer 550 preferably including an oxide such as silicon dioxide.

The structure further includes a dielectric fill 1000 and conductive vias 1100 contacting silicide regions 32 overlying the source and drain regions 24 of the NFET 10 and the PFET 20 and conductive vias 1102 contacting silicide regions 28 of the gate conductors of the NFET and the PFET.

Thus, in the structure illustrated, permanent tensile and compressive stresses are applied to the NFET and the PFET, respectively, to improve the performance of each. A high level of stress can be applied because both tensile and compressive stresses are applied to localized regions of the wafer in which the NFET and the PFET are disposed.

The magnitudes of the stresses applied to each region can be controlled by the film thickness and characteristics of an ion implantation, as will be discussed later. An advantage of the structure 12 is that the topography of the wafer is more even between the regions of the wafer in which the PFET and NFETs are formed. This results because limited processes, such as reactive ion etch (RIE) processes, are applied to the structure to form the stressed films, and a relatively thin layer of oxide is used as an intermediate layer between the stressed films.

The NFET 10 and PFET 20 shown in FIG. 1 are formed from a substrate 16. The substrate 16 may either be a bulk substrate or, more preferably, a semiconductor-on-insulator substrate, such as a silicon-on-insulator (SOI) substrate, in which a relatively thin single-crystal semiconductor region 14 of a semiconductor is formed over an insulating layer 18, as shown. When field effect transistors (FETs) are formed in such SOI substrates, faster switching operation is often achieved than otherwise, because junction capacitance between the channel region of the transistor and the bulk substrate is eliminated. Preferably, a single-crystal semiconductor region 14 of silicon is provided as the semiconductor-on-insulator layer.

Reference is made herein to NFET and PFET transistors having channel regions disposed within a single-crystal silicon region of a substrate. However, the present invention is not limited to the fabrication of transistors in a pure silicon crystal. In place of silicon, the single crystal semiconductor region 14 may consist essentially of a semiconductor alloy such as that of silicon germanium. The teachings of the present invention are also understood to apply to the fabrication of transistors in other types of semiconductor materials such as III-V compound semiconductors having a composition $Al_A In_B Ga_C As_D P_E N_F$, wherein A, B, C, D, E and F represent the respective percentages of each element Al, In, Ga, As, P and N in the semiconductor crystal, the percentages totaling 100. Gallium arsenide (GaAs), indium phosphide (InP), gallium nitride (GaN), and InGaAsP are common examples of such semiconductors.

With continued reference to FIG. 1, the gate conductors of the NFET and the PFET have dopant types and concentrations provided according to the workfunctions needed for each type of transistor. The gate conductor of the PFET is p+ doped, e.g., using boron, while the gate conductor of the NFET is n+ doped e.g., using phosphorus or arsenic. This is achieved by heavily doped polysilicon lower layers 26 of the gate conductors being preferably doped to concentrations between about $10^{18}$ cm$^{-3}$ to $10^{20}$ cm$^{-3}$.

Each gate conductor preferably includes a low-resistance portion 28 disposed above the polysilicon portion 26. The low-resistance portion 28 has much less resistance than the polysilicon portion 26, the low-resistance portion preferably including a metal, a silicide of a metal, or both. In a preferred embodiment, the low-resistance portion 28 includes a silicide formed by a self-aligned process (a "salicide"), being a conductive silicide of a silicide precursor metal such as nickel but not limited to tungsten, titanium and cobalt. More preferably, the silicide is a compound of cobalt ($CoSi_2$). Alternatively, each gate conductor can include a metal layer in place of the polysilicon layer 26 such as a metal layer formed as a replacement gate after high temperature processing of the source and drain regions of the transistor have been completed.

The NFET 10 includes a channel region 92 and the PFET 20 includes a channel region 91, both channel regions being disposed below the respective gate conductor 26, as separated therefrom by a gate dielectric 27. The gate dielectric 27 preferably includes a layer of silicon dioxide which is thermally grown from the surface of the single-crystal semiconductor region 14.

The NFET and the PFET further include first spacers 40 disposed on sidewalls of the gate conductors. The spacers 40 are preferably formed of a conformably deposited dielectric material such as an oxide, e.g., silicon dioxide, or a nitride such as silicon nitride.

Halo and extension regions 22 are disposed adjacent to the gate conductors 26, their locations determined by the thickness of spacers 40. Second spacers 30 are disposed on sidewalls of the first spacers 40. Each transistor further includes source and drain regions 24 disposed on alternate sides of the gate conductors, the locations of the source and drain regions being determined by the combined thicknesses of the first and second spacers 30 and 40.

Figure 2A:
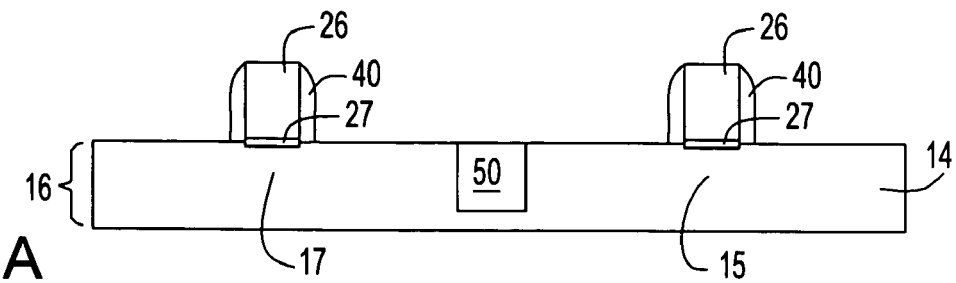
FIGS. 2A through 10 illustrate stages in fabrication of a PFET and an NFET according to an embodiment of the invention.

FIGS. 2A through 10 illustrate stages in the fabrication of the structure 12, according to an embodiment of the invention. FIGS. 2A illustrates a stage in which the polysilicon gate conductor (GC) layers 26 are formed to overlie an NFET device region 15 and a PFET device region 17 of the single-crystal semiconductor region 14 of the substrate 16. For ease of illustration, the insulating layer 18 and the portion of the substrate 16 underlying the insulating layer are omitted from the views shown in FIGS. 2A through 10. The polysilicon GC layers 26 are spaced from the respective device regions 15, 17 by a gate dielectric 27, which is preferably an oxide thermally grown on the surface of the single-crystal semiconductor region 14. Workfunction doping of the gate conductors, as discussed above, is preferably already provided by this stage of fabrication. Spacers 40 are also provided, and the shallow trench isolation region 50 has already been provided at this stage.

Figure 2B:
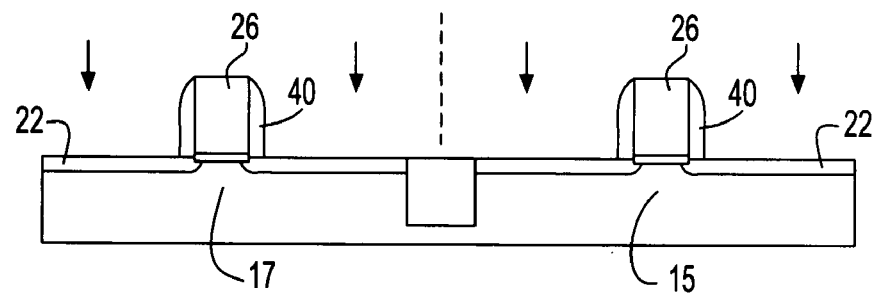

As shown in FIG. 2B, extension and halo regions 22 are formed in both the NFET and PFET device regions 15, 17, by implantation, using the polysilicon GC layers 26 and spacers 40 as masks determining the edges of the implanted regions. When the implants are performed to the NFET device region 15, the PFET device region 17 is prevented from being implanted by a mask formed over the PFET device region. When the implants are performed to the PFET device region 17, the NFET device region 15 is prevented from being implanted by a mask formed over the NFET device region.

Figure 3:
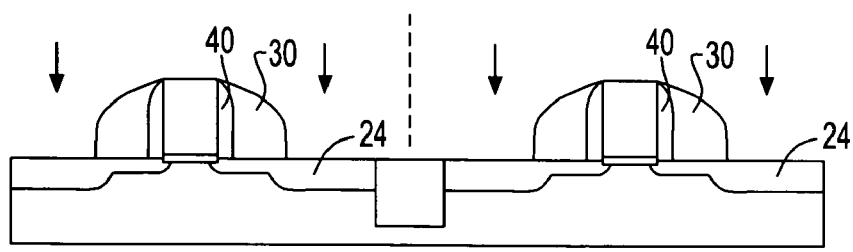

Thereafter, as shown in FIG. 3, second spacers 30 are formed on sidewalls of the first spacers 40. Thereafter, implantations are performed to define the source and drain regions 24 for the NFET and the PFET, in a similar manner to that in which the halo and extension implants are performed.

Figure 4:
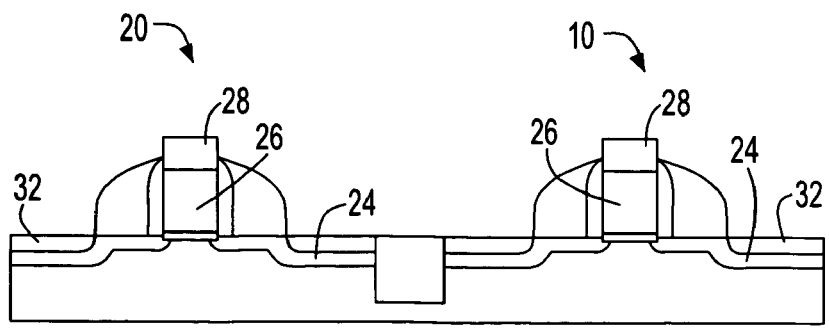

Thereafter, as shown in FIG. 4, silicide regions 28 and 32 are formed overlying the gate conductors 26 and the source and drain regions of the transistors. These silicide regions are preferably formed in a self-aligned manner by depositing a silicide precursor metal, reacting the deposited metal with the underlying silicon material and then removing any unreacted metal that remains, through a wet cleaning process, for example. At the conclusion of this step, the NFET 10 and the PFET 20 are fully formed.

Figure 5:
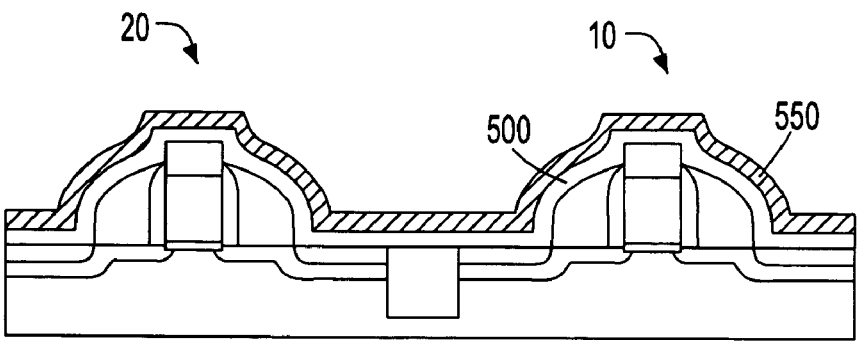

In FIG. 5, a unitary compressive stressed film 500 is formed over the PFET 20 and the NFET 10. The film 500 preferably consists of a nitride, such as silicon nitride, as illustrated in FIG. 5. Preferably, the thickness of the film 500 and the parameters of its deposition are selected so as to achieve a particular magnitude of stress.

Thereafter, an intermediate film 550, which is preferably not stressed, is deposited over the structure. Film 550 is preferably a dielectric layer rather than conductive or semi-conductive in nature, and is preferably conformal to the contour of the underlying topography. Preferably, film 550 includes an oxide, preferably being silicon dioxide, and such layer can be formed, for example, by a low temperature deposition such as from a tetra-ethylorthosilicate (TEOS) precursor. In one preferred embodiment, the thickness of this layer is between 50 angstroms (Å) and 150 angstroms (Å).

Figure 6:
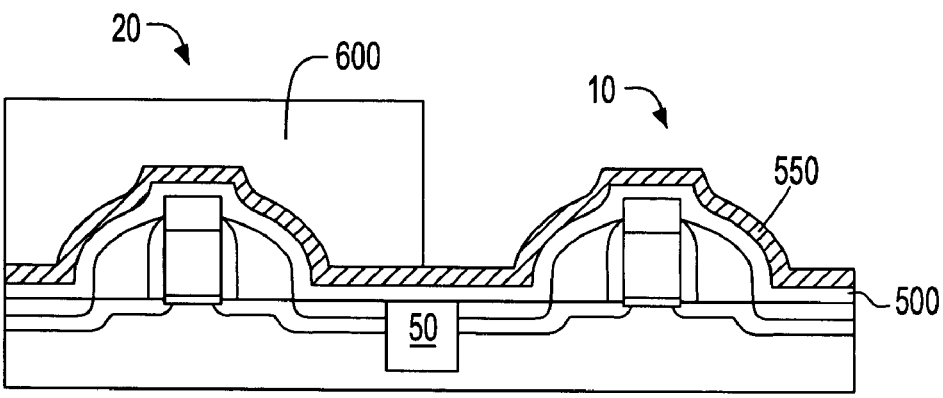

Thereafter, as shown in FIG. 6, the PFET 20 is masked while a step is performed to remove the intermediate film 550 which overlies the NFET 10.

Figure 7:
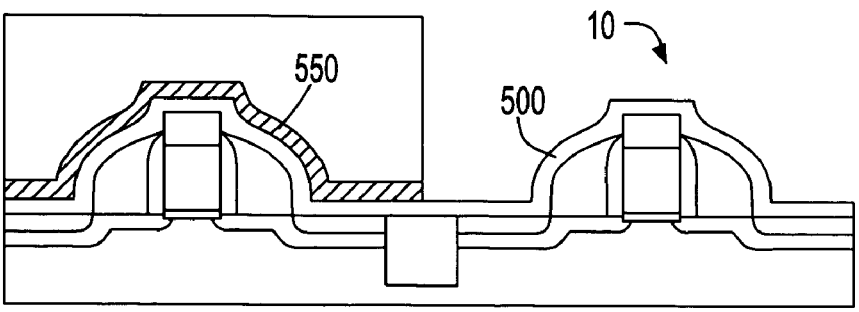

FIG. 7 illustrates the structure after the intermediate film 550 is removed from the NFET 10. An etching technique is used which is selective to the underlying nitride film 500 to remove the oxide film 550 from the region overlying the NFET 10, as illustrated.

Figure 8:
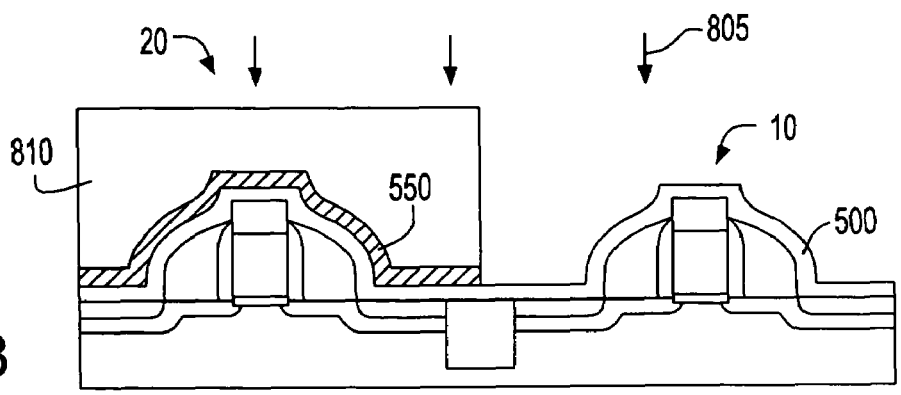

Thereafter, as illustrated in FIG. 8, the portion of the stressed film 500 that is exposed and overlying the NFET 10 is implanted with ions, preferably germanium (Ge) ions, as shown by arrows 805. During this step, the stressed film 500 that overlies the PFET 20 is protected from being substantially altered by a mask 810.

The dose and energy of the ion implantation can be adjusted so that the stress in the implanted film 500 is reduced to a value close to zero. The ion implantation reduces the film stress by breaking bonds between silicon and nitrogen atoms, and causing dislocations. Experiments have demonstrated that both tensile and compressive stress can be reduced through ion implantation to values close to zero. As a result of the ion implantation, the stress present in the silicon nitride film 500 overlying the NFET 10 is relaxed while the same film 500 retains a compressive stress in the area overlying the PFET 20. Moreover, upon conducting a thermal cycle such as annealing, the implanted portion of the film 500 can be converted to a tensile-stressed film.

Subsequent thereto, a thermal annealing process is preferably conducted. Due to the presence of the implanted ion concentration (Ge) in the portion of the film 500 overlying the NFET 10, the annealing process transforms portion of the film 500 overlying the NFET 10 to a film having a much lower magnitude of stress than that originally deposited. As a result of this process, the implanted portion of the film may even be converted to a tensile-stressed film. The portion of the stressed film 500 overlying the NFET is referenced as 902 in FIG. 1. The remaining portion of the film which overlies the PFET 20 is referenced as 901 in FIG. 1.

Figure 9:
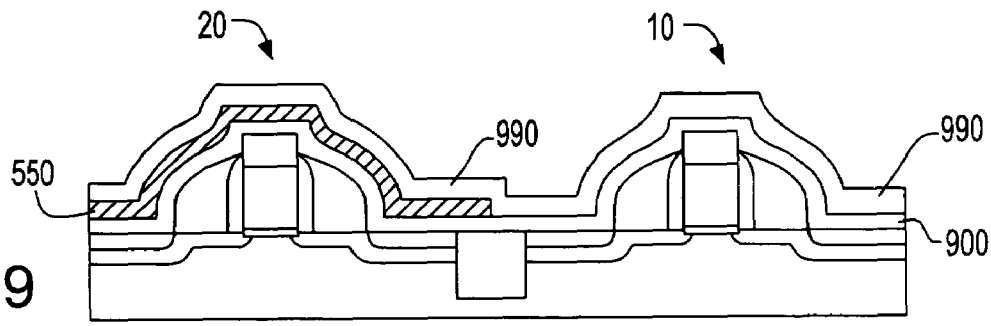

As further illustrated in FIG. 9, preferably, a second stressed film 990 is formed specifically to apply a tensile-stressed film to the NFET 10. The second stressed film 990 is formed to overlie both the NFET 10 and the PFET 20, as illustrated. The second layer of film 990 preferably includes a tensile stressed nitride film, such as silicon nitride, for applying a tensile stress to the NFET 10. The thickness and characteristics of this second film 990 are selected to impart a desired level of tensile stress to the channel region of the NFET 10.

Once the second stressed film 990 is formed, the previously formed oxide layer 550 functions to maintain the stressed film 990 at a sufficient distance from the underlying compressive stressed PFET 20 so as not to interfere with the amount of compressive stress which is desired to be induced in the channel region of the PFET 20.

Figure 10:
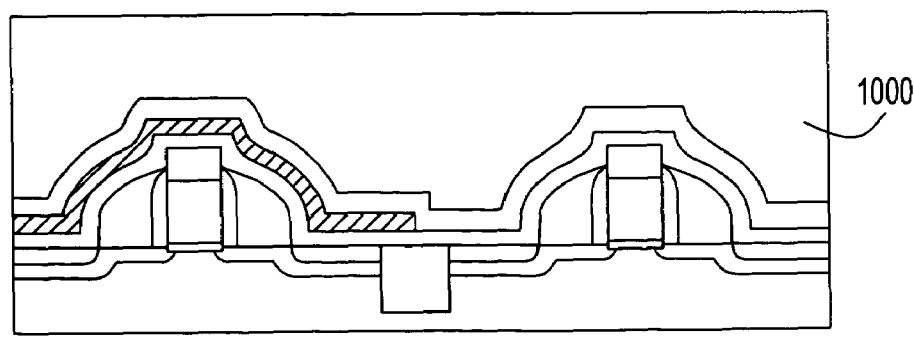

As further shown in FIG. 10, a layer of dielectric material 1000 is deposited over the structure containing the NFET 10 and the PFET 20. The dielectric layer can be formed of any of a variety of insulating materials, such as an oxide, e.g. a TEOS deposited oxide, a doped glass such as borophosphosilicate (BPSG) glass, or a low-K dielectric such as an organic material.

Referring to FIG. 1 again, to complete the structure conductive vias are formed in the dielectric region to provide conductive vias 1100 contacting the silicide regions 32 disposed on the source and drain regions, as well as conductive vias 1102 contacting the silicide regions 28 of the gate conductors. The conductive vias are filled with a conductive material such as a metal or metal silicide to provide electrical connections to the NFET and PFET.

Many variations are contemplated within the scope of the invention. In one embodiment, stressed films are formed to impart stresses to the conduction channels of devices other than PFET and NFETs (e.g., gated diodes, silicon-controlled rectifiers, triacs, etc., to name but a few).

In one such variation, instead of depositing and patterning the intermediate film over the PFET prior to forming the second stressed film, the second stressed film can be formed over both the NFET and the PFET and then patterned to remove that film from overlying the PFET, provided that such steps are performed at relatively low temperatures and under such conditions which avoid altering the characteristics of the compressive stressed portion 901 (FIG. 1) of the unitary stressed film.

In one variation of the above-described embodiment, the unitary-stressed film, as deposited over the NFET and the PFET, has a tensile stress having a first magnitude. This film imparts a tensile stress having a desirably high magnitude to the conduction channel of the NFET. After forming the unitary stressed film, the NFET is masked, and ions (e.g., Ge ions) are implanted into a portion of the unitary stressed film which overlies the PFET. After annealing, the portion of the unitary stressed film which overlies the PFET has either a tensile stress having a magnitude much lower than the first magnitude, a zero stress, or a compressive stress. In such embodiment, the second stressed film overlying the PFET desirably has a high magnitude compressive stress, in order to provide a desirably high magnitude compressive stress to the conduction channel of the PFET.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. A method of fabricating a semiconductor device structure, comprising:
   a) forming a p-type field effect transistor (PFET) and an n-type field effect transistor (NFET), each of the NFET and the PFET having a conduction channel disposed in a single-crystal semiconductor region of a substrate;
   b) forming a first stressed film having a compressive stress over the PFET and the NFET;
   c) forming an intermediate layer overlying the first stressed film over the PFET but not overlying the NFET;
   d) applying a mask to cover the PFET while exposing the NFET;
   e) ion implanting a portion of the first stressed film overlying the NFET to form and implanted portion, the mask protecting another portion of the first stressed film overlying the PFET from the ion implantation;
   f) annealing the substrate, whereby the portion or the first stressed film protected by the mask during step (e) applies a compressive stress to the conduction channel of the PFET at a first magnitude and the magnitude of the stress applied to the conduction channel of the NFET by the implanted portion of the first stressed film is much reduced from the first magnitude—by; and
   g) forming a second stressed film overlying the intermediate layer over the PFET, the second stressed film overlying the implanted portion of the first stressed film over the NFET and the second stressed film applying a tensile stress to the conduction channel of the NFET.

2. The method of claim 1, wherein the second stressed film consists essentially of silicon nitride.

3. The method of claim 1, wherein the intermediate layer consists essentially of an oxide.

4. The method of claim 3, wherein the intermediate layer consists essentially of silicon dioxide.

5. The method of claim 4, wherein the silicon dioxide is deposited at a low temperature.

6. The method of claim 5, wherein the silicon dioxide is deposited from a tetra-ethylorthosilicate (TEOS) precursor.

7. The method of claim 1, wherein a thickness of the first stressed film is varied to adjust the first magnitude of the stress.

* * * * *